United States Patent
Wang et al.

(10) Patent No.: US 7,923,279 B2
(45) Date of Patent: Apr. 12, 2011

(54) METHOD AND STRUCTURE FOR REDUCING CROSS-TALK IN IMAGE SENSOR DEVICES

(75) Inventors: Ching-Chun Wang, Tainan (TW); Tzu-Hsuan Hsu, Kaohsiung (TW); Han-Chi Liu, Miaoli County (TW); Chun-Ming Su, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/405,454

(22) Filed: Mar. 17, 2009

(65) Prior Publication Data

US 2010/0181635 A1    Jul. 22, 2010

Related U.S. Application Data

(63) Continuation-in-part of application No. 12/357,223, filed on Jan. 21, 2009, now Pat. No. 7,824,948.

(51) Int. Cl.
*H01L 21/00* (2006.01)

(52) U.S. Cl. .......... 438/57; 257/446; 257/E31.001; 257/E31.103; 257/431

(58) Field of Classification Search .......... 438/57; 257/431, E31.001, E31.103
See application file for complete search history.

(56) References Cited

U.S. PATENT DOCUMENTS

| 6,458,619 B1 * | 10/2002 | Irissou ............... 438/66 |
| 2009/0057801 A1 * | 3/2009 | Goushcha et al. ...... 257/437 |

* cited by examiner

*Primary Examiner* — Matthew C Landau
*Assistant Examiner* — Sonya D McCall-Shepard
(74) *Attorney, Agent, or Firm* — Haynes and Boone, LLP (57) ABSTRACT

Provided is a method of fabricating an image sensor device. The method includes providing a semiconductor substrate having a front side and a back side, forming a first isolation structure at the front side of the semiconductor substrate, thinning the semiconductor substrate from the back side, and forming a second isolation structure at the back side of the semiconductor substrate. The first and second isolation structures are shifted with respect to each other.

20 Claims, 11 Drawing Sheets

METHOD AND STRUCTURE FOR REDUCING CROSS-TALK IN IMAGE SENSOR DEVICES

PRIORITY DATA

This application is a continuation-in-part of U.S. application Ser. No. 12/357,223, filed on Jan. 21, 2009, entitled "METHOD AND STRUCTURE FOR REDUCING CROSS-TALK IN IMAGE SENSOR DEVICES", the contents of which are incorporated herein by reference.

BACKGROUND

In semiconductor technologies, image sensors are used for sensing a volume of exposed light projected towards a semiconductor substrate. Complementary metal-oxide-semiconductor (CMOS) image sensors (CIS) and charge-coupled device (CCD) sensors are widely used in various applications such as digital still camera or mobile phone camera applications. These devices utilize an array of pixels or image sensor elements, including photodiodes and transistors, to collect photo energy to convert images into electrical signals. However, image sensor devices suffer from "cross-talk." That is, light targeted for one image sensor element (and the electrical signal generated thereby) may spread to neighboring image sensor elements, which causes cross-talk. Cross-talk will degrade spatial resolution, reduce overall optical sensitivity, and result in poor color separation.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
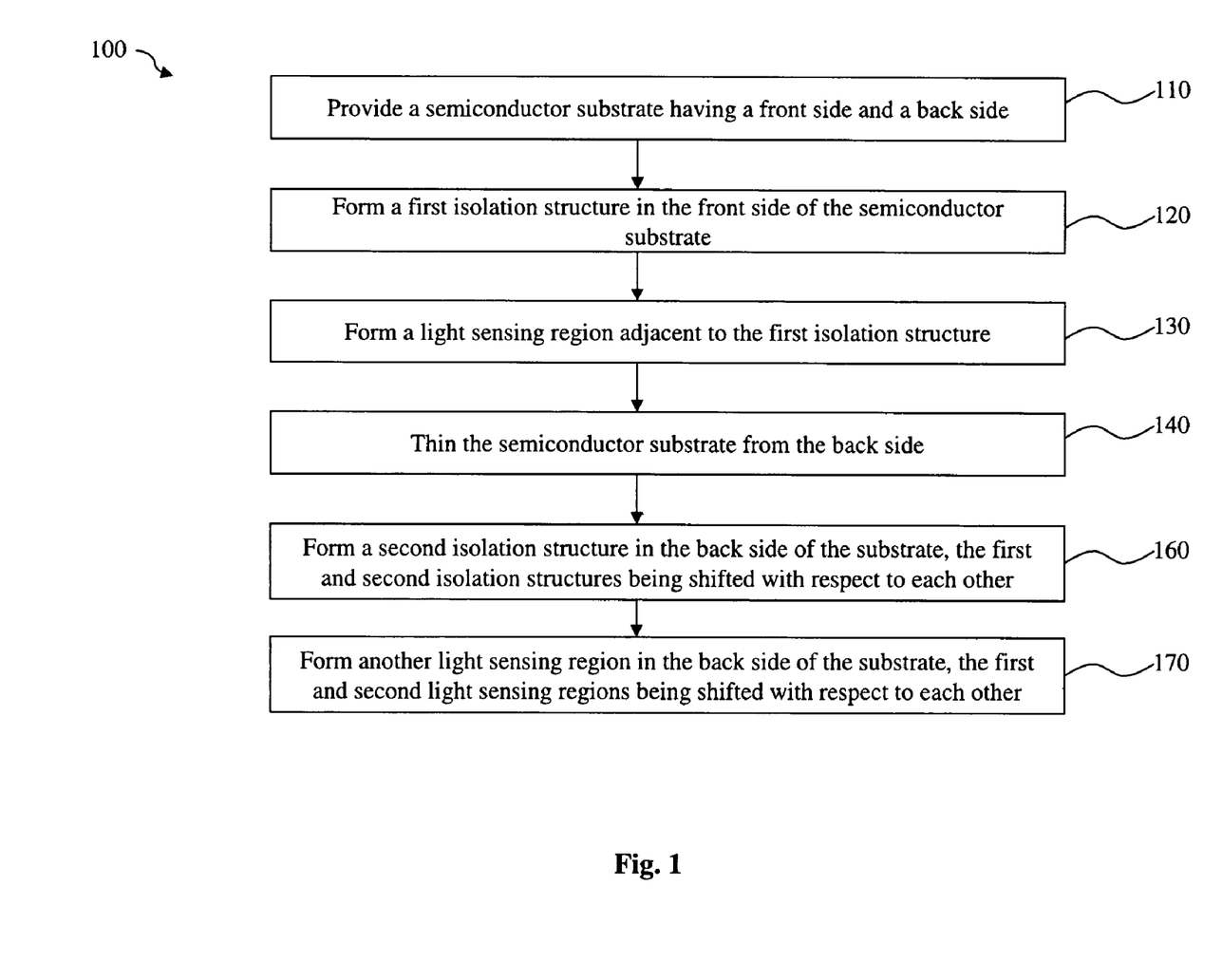
FIG. 1 is a flowchart illustrating a method for fabricating a back-side illuminated (BSI) image sensor device according to various aspects of the present disclosure.
Figure 3:
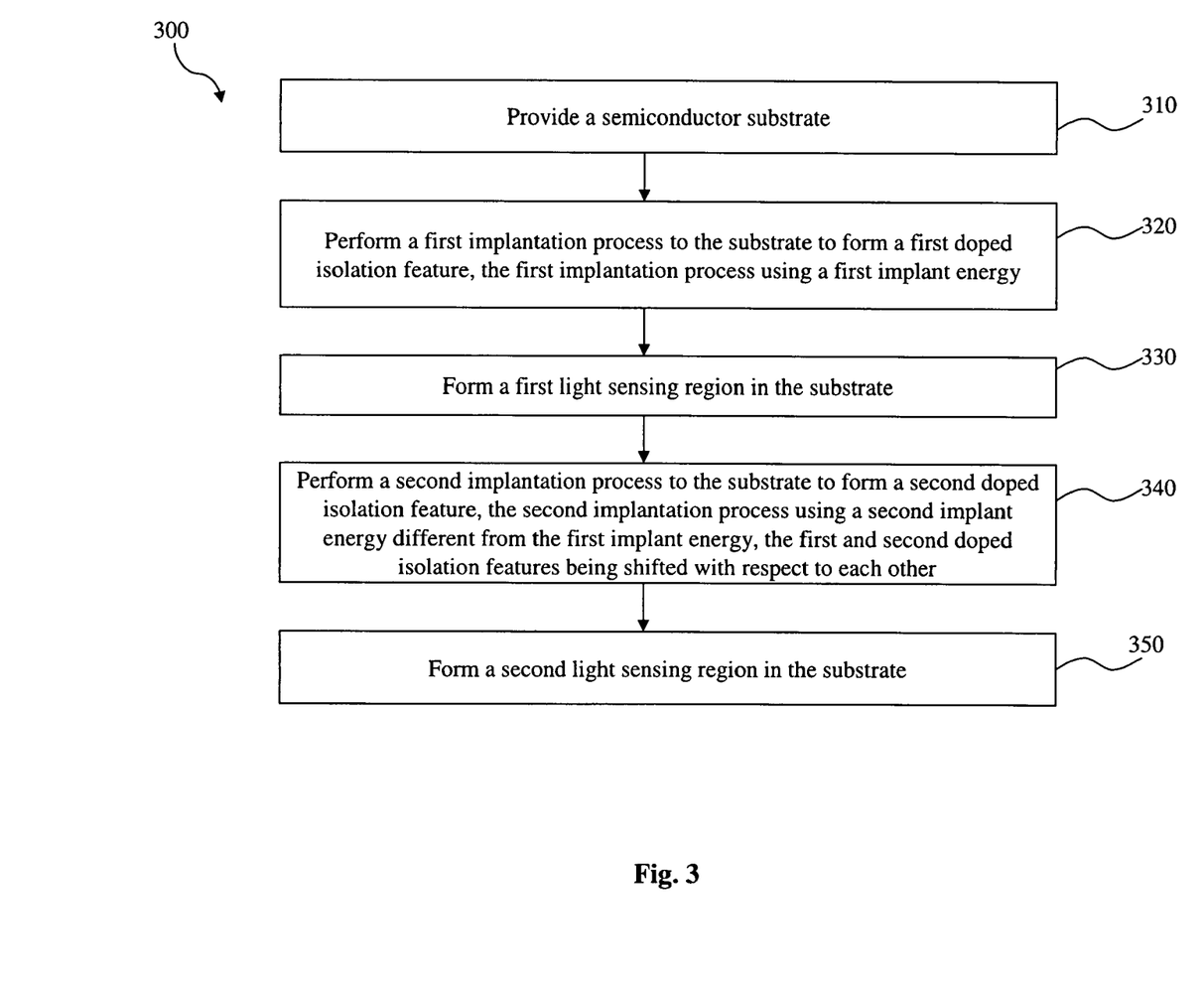
FIG. 3 is a flowchart illustrating a method for fabricating a front-side illuminated (FSI) image sensor device according to various aspects of the present disclosure.
Figure 4A:
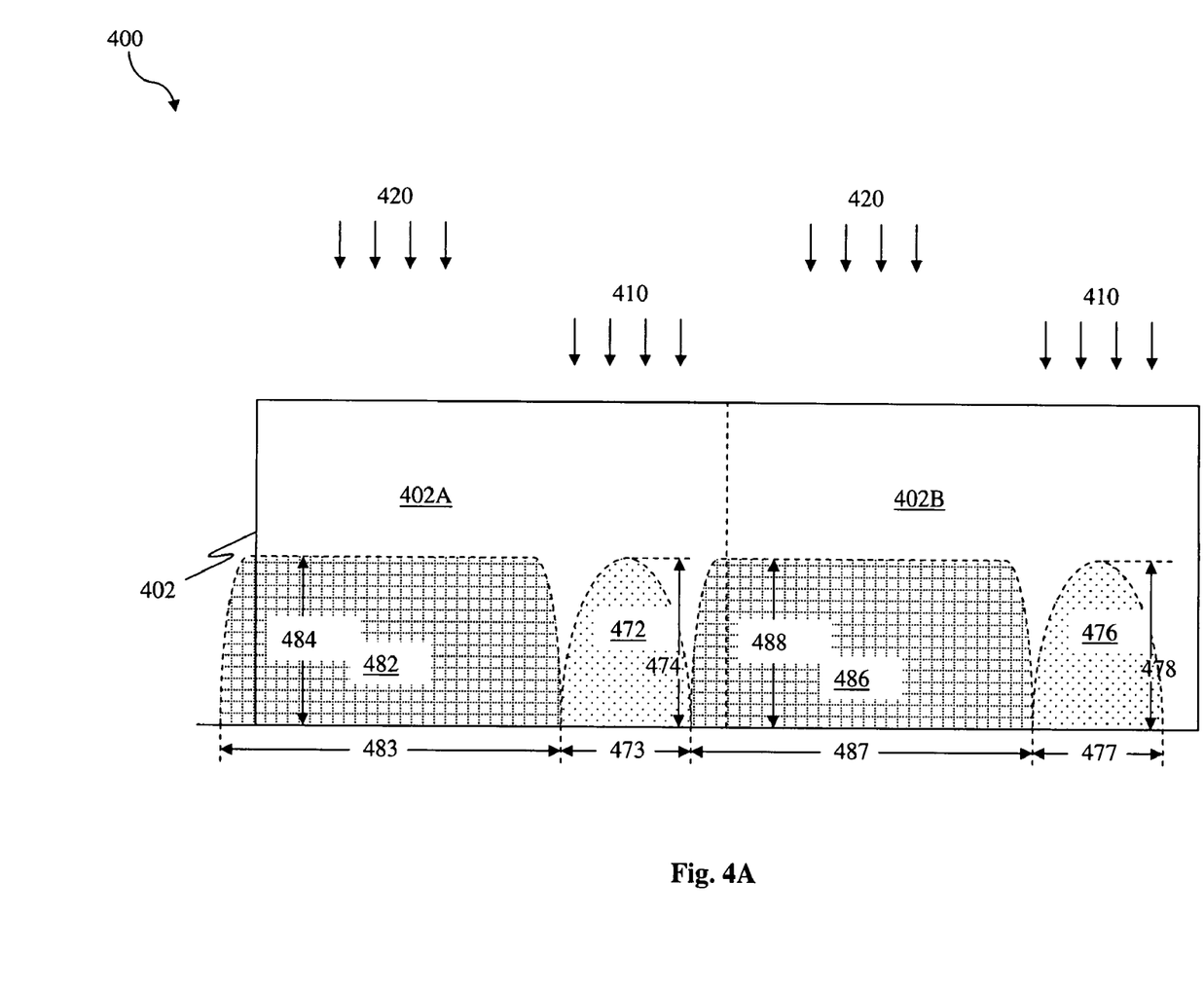
FIGS. 4A-4C are cross-sectional views of an FSI image sensor device at various stages of fabrication according to the method of FIG. 3.
Figure 4B:
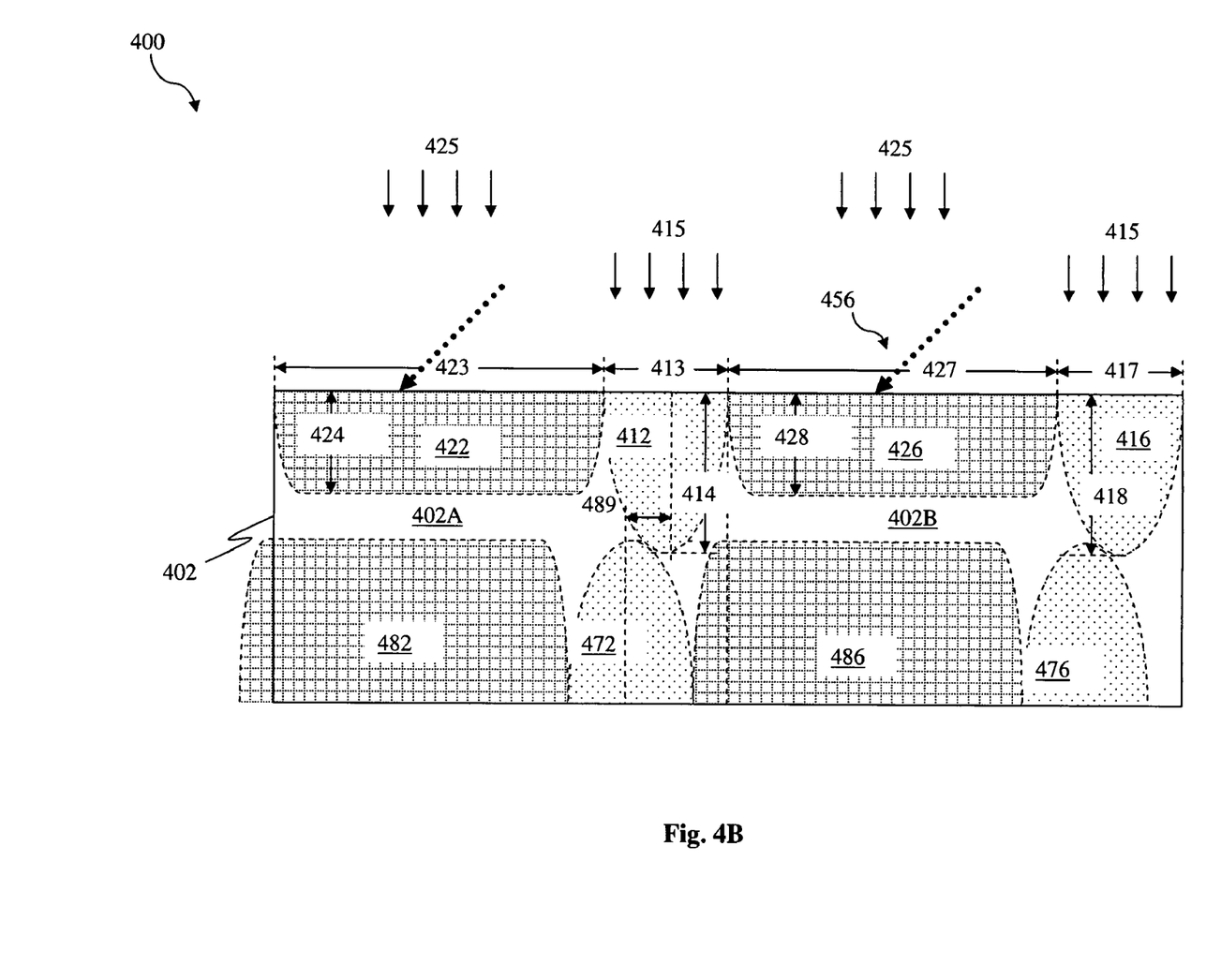
Figure 4C:
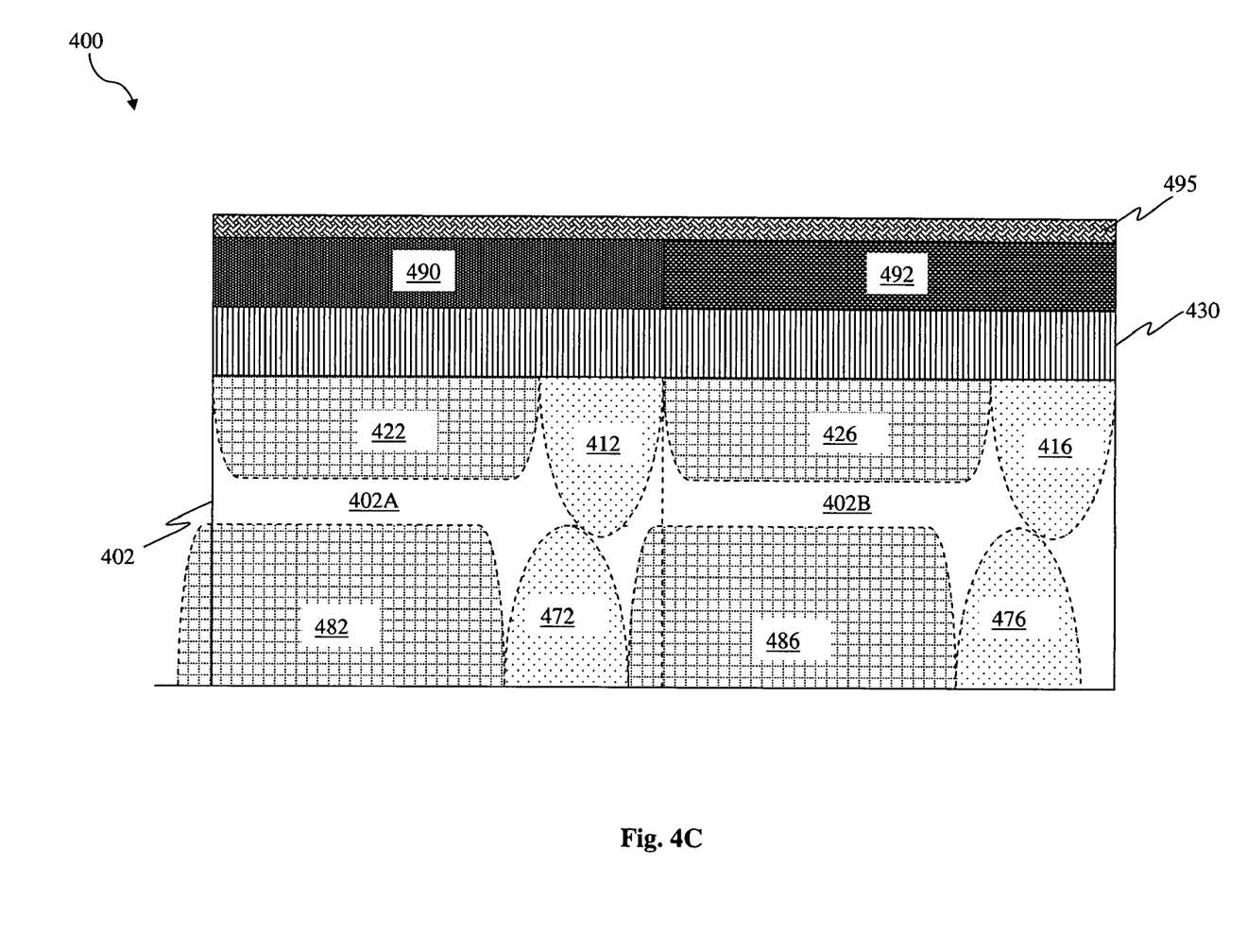
Figure 5:
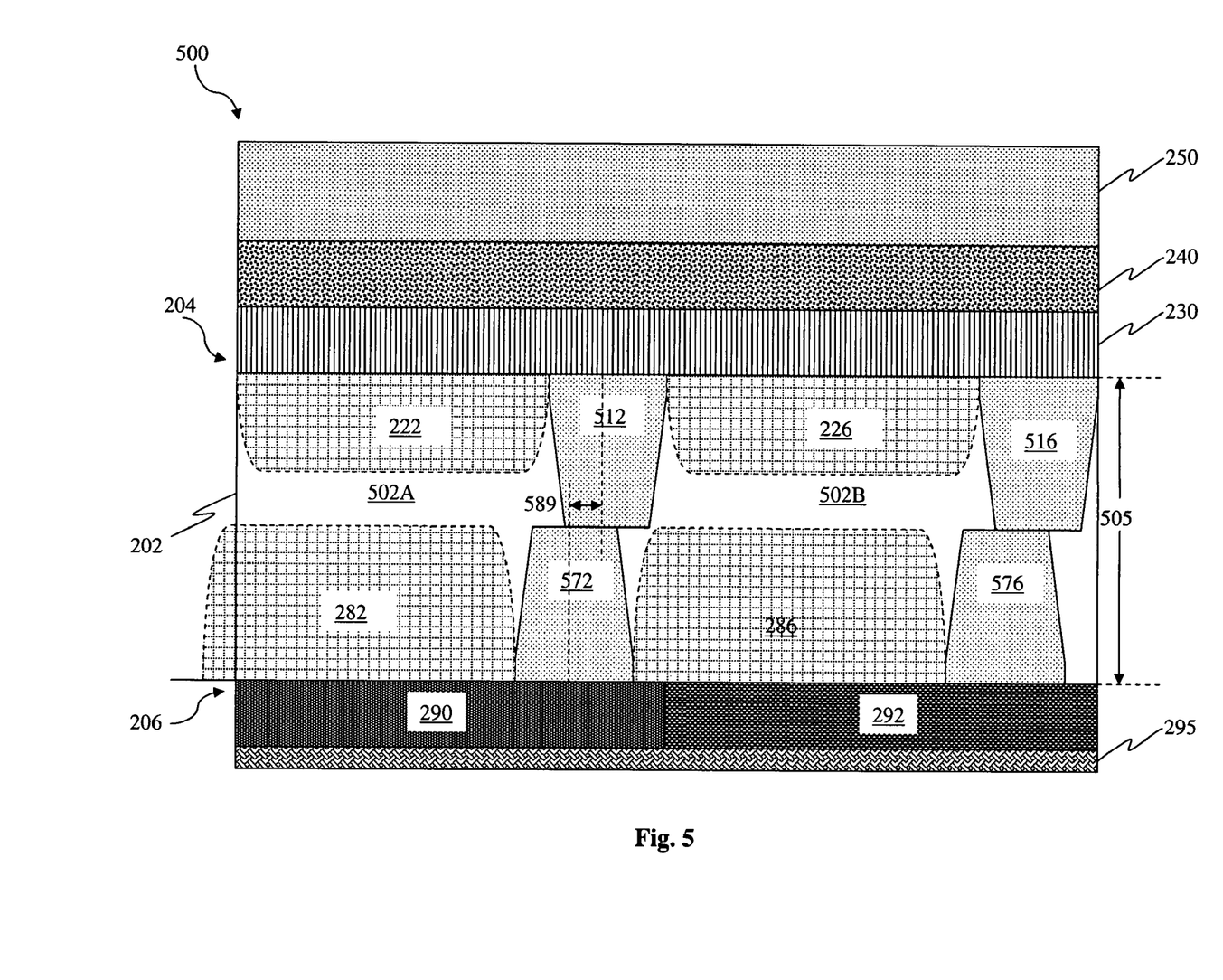
FIG. 5 is a cross-sectional view of an alternative embodiment of an BSI image sensor device according to various aspects of the present disclosure.

Illustrated in FIG. 1 is a flowchart of a method 100 for fabricating a back-side illuminated (BSI) image sensor device with shifted isolation structures according to various aspects of the present disclosure. FIGS. 2A to 2E are cross-sectional views of one embodiment of a BSI image sensor device 200 at various stages of fabrication according to the method 100 of FIG. 1. Illustrated in FIG. 3 is a flowchart of a method 300 for fabricating a front-side illuminated (FSI) image sensor device with shifted isolation structures according to various aspects of the present disclosure. FIGS. 4A to 4C are cross-sectional views of one embodiment of a FSI image sensor device 400 at various stages of fabrication according to the method 300 of FIG. 3. FIG. 5A is cross-sectional views of an alternative embodiment of a BSI image sensor device 500. The image sensor devices 200, 400, and 500 include an array or grid of pixels for sensing and recording an intensity of light radiation directed towards either a back-side (e.g., BSI image sensor devices 200, 500) or front-side (e.g., FSI image sensor device 400). The image sensor devices 200, 400, and 500 may include a charge-coupled device (CCD), complimentary metal oxide semiconductor (CMOS) image sensor (CIS), an active-pixel sensor (APS), and a passive-pixel sensor. The image sensor devices 200, 400, and 500 further includes additional circuitry and input/outputs that are provided adjacent to the grid of pixels for providing an operation environment for the pixels and for supporting external communication with the pixels. It is understood that FIGS. 2A-2E, FIGS. 4A-4C, and FIG. 5 have been simplified for a better understanding of the inventive concepts of the present disclosure.

Referring to FIG. 1, the method 100 begins with block 110 in which a semiconductor substrate having a front side and a back side is provided. The method 100 continues with block 120 in which a first isolation structure is formed in the front side of the semiconductor substrate. The method 100 continues with block 130 in which a light sensing region is formed adjacent to the first isolation structure. The method 100 continues with block 140 in which the semiconductor substrate is bonded with a carrier wafer and thinned from the back side. The method 100 continues with block 160 in which a second isolation structure is formed in the back side of the semiconductor substrate. The first and second isolation structures are shifted with respect to each other. The method 100 continues with block 170 in which another light sensing region is formed in the back side of the semiconductor substrate. The first and second light sensing regions are shifted with respect to each other.

Figure 2A:
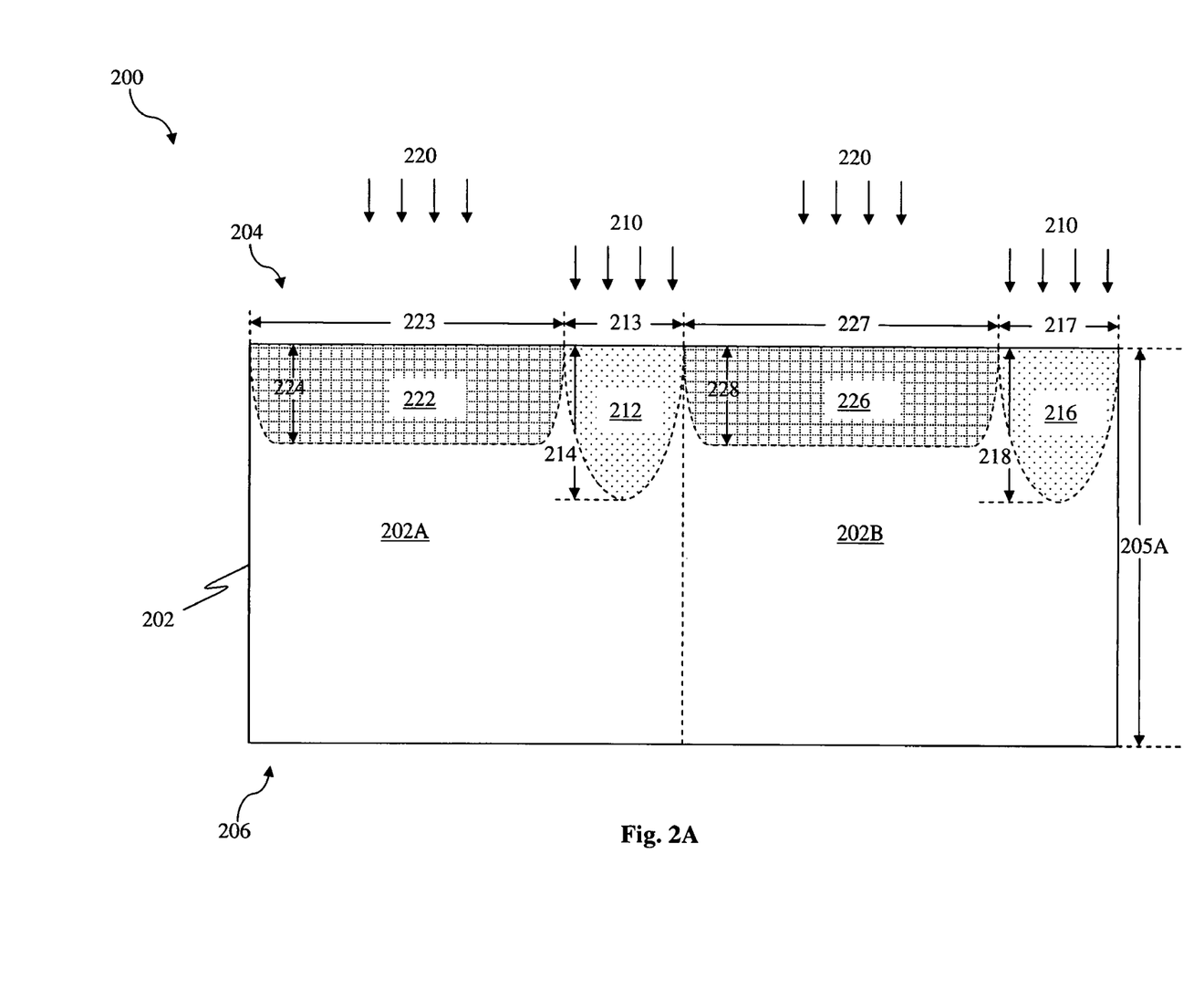
FIGS. 2A-2E are cross-sectional views of an BSI image sensor device at various stages of fabrication according to the method of FIG. 1.

Referring to FIG. 2A, an BSI image sensor device 200 includes a semiconductor substrate 202 having a front side 204 and a back side 206. In the present embodiment, the substrate 202 is a silicon substrate doped with a P-type dopant such as boron (e.g., P-type substrate). In another embodiment, the substrate 202 is a silicon substrate doped with an N-type dopant such as phosphorous (e.g., N-type substrate). In other embodiments, the substrate 202 includes other elementary semiconductors such as germanium and diamond. Alternatively, the substrate 202 may optionally include a compound semiconductor and/or an alloy semiconductor. Further, the substrate 202 may include an epitaxial layer (epi layer), may be strained for performance enhancement, and may include a silicon-on-insulator (SOI) structure. In the present embodiment, the substrate 202 include pixels 202A and 202B that are operable to detect a light radiation. It is understood that only two pixels are illustrated for the sake of clarity and that many number of pixels may be implemented. The pixels 202A and 202B have light sensing regions that are separated and isolated from each other by an isolation structure that prevents carriers from spreading into neighboring pixels, which would generate noise known as cross-talk. The substrate 202 has an initial thickness 205A that ranges from 100 um to 3000 um. In the present embodiment, the initial thickness 205A is about 700 um.

An implantation process 210 is performed to the front side 204 of the substrate 202 to form doped isolation regions 212 and 216 in pixels 202A and 202B, respectively. For example, a photoresist layer may be patterned by a lithography process to define openings for the doped isolation regions 212 and 216. The implantation process 210 uses a dopant that is the same type used to dope the substrate 202. In the present embodiment, the implantation process 210 uses boron as a dopant and has an implantation energy ranging from about 100 KeV to about 1200 KeV, preferably between about 400 KeV and about 500 KeV. The implantation process 210 in the present embodiment also uses a dose level ranging from about $3\times10^{12}$ atoms/cm$^2$ to about $3\times10^{14}$ atoms/cm$^2$, preferably between about $3\times10^{12}$ and about $1\times10^{13}$ atoms/cm$^2$. In another embodiment, the implantation process 210 uses phosphorous as a dopant and has an implantation energy ranging from about 100 KeV to about 2000 KeV, preferably between about 600 KeV and about 800 KeV. The implantation process 210 also uses a dose level ranging from about $3\times10^{12}$ atoms/cm$^2$ to about $3\times10^{14}$ atoms/cm$^2$, preferably between about $3\times10^{11}$ and $1\times10^{13}$ atoms/cm$^2$. The doped isolation regions 212 and 216 have widths 213 and 217, respectively, and depths 214 and 218, respectively. The widths 213 and 217 may range from about 0.1 um to about 0.8 um, and the depths 214 and 218 may range from about 0.5 um to about 2 um. In the present embodiment, the widths 213 and 217 are about 0.4 um, and the depths 214 and 218 are about 1 um. It is understood that the specified parameters of the implantation process and dimensions of the doped isolation regions are mere examples and that other values may be implemented.

An implantation process 220 is performed to the front side 204 of the substrate 202 to form light sensing regions 222 and 226 of pixels 202A and 202B, respectively. The implantation process 220 uses a dopant that is different from the type of dopant used to dope the substrate 202 (and also different from the dopant used in the implantation process 210). In the present embodiment, the implantation process 220 uses phosphorous or arsenic as a dopant. In another embodiment, the implantation process 220 uses boron as a dopant. The light sensing regions 222 and 226 have widths 223 and 227, respectively, and depths 224 and 228, respectively. The widths 223 and 227 may range from about 0.5 um to about 5 um, and the depths 224 and 228 may range from about 0.2 um to about 1.5 um. In the present embodiment, the widths 223 and 227 are about 1.35 um, and the depths 224 and 228 are about 0.4 um.

The light sensing regions 222 and 226 are formed adjacent to the doped isolation regions 212 and 216, respectively. In the present embodiment, the light sensing regions 222 and 226 are operable to detect light radiation. It should be noted that the light sensing regions can be varied from one another, such as having different junction depths, thicknesses, and so forth. Further, it is understood that although the pixels 202A and 202B are generally illustrated as photodiodes for the sake of example, other pixels types may be implemented including pinned layer photodiodes, photogates, reset transistors, source follower transistors, and transfer transistors.

Figure 2B:
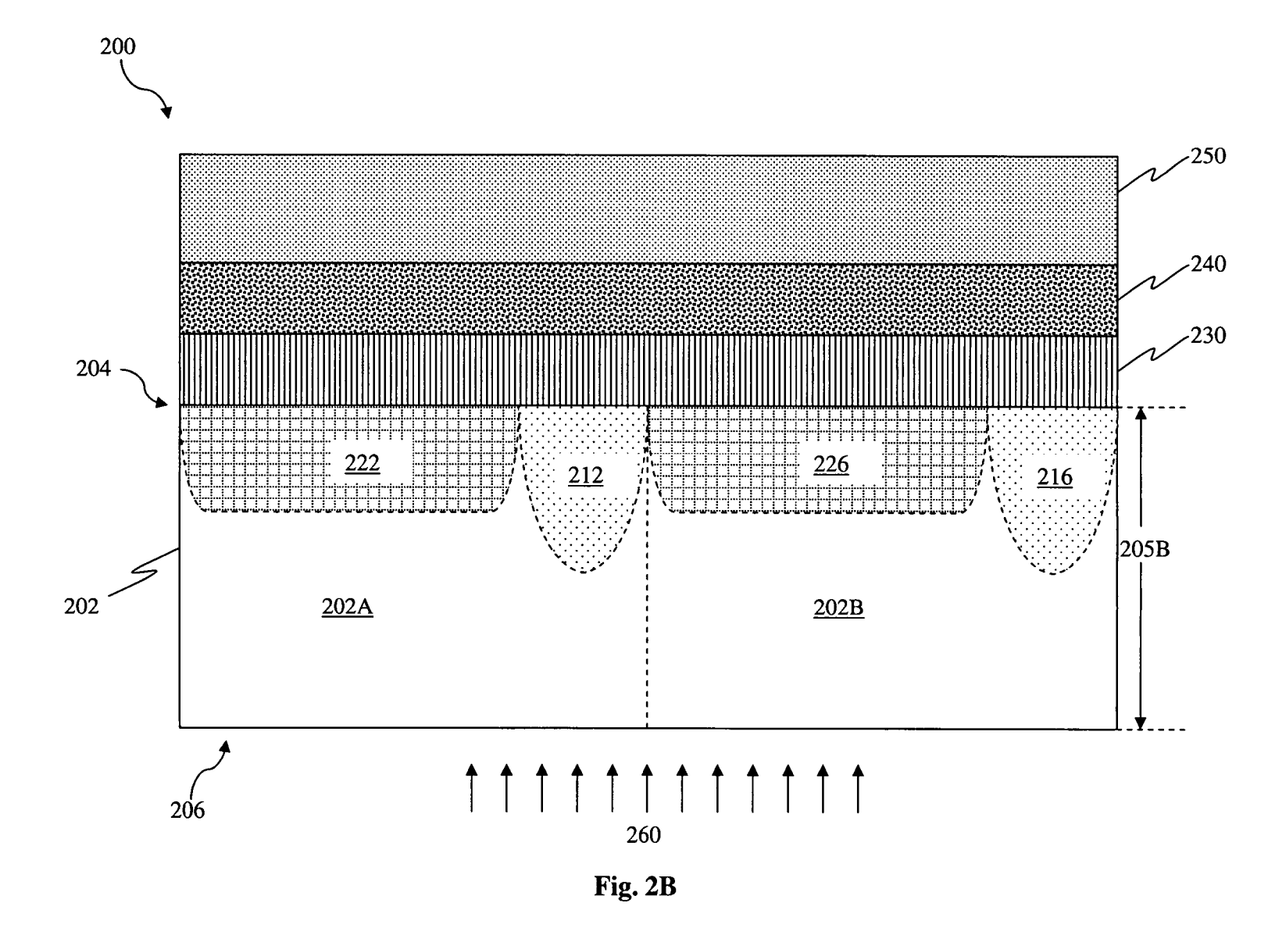

Referring to FIG. 2B, an interconnect structure 230 is formed on the front side 204 of the substrate 202 prior to thinning the substrate 202. The interconnect structure 230 includes a plurality of patterned dielectric layers and conductive layers that provide interconnections (e.g., wiring) between the various doped features, circuitry, and input/output of the image sensor device 200. The interconnect structure 230 includes an interlayer dielectric (ILD) and a multilayer interconnect (MLI) structure formed in a configuration such that the ILD separates and isolates each MLI structure from other MLI structures. The MLI structure includes contacts, vias and metal lines formed on the substrate 202. In one example, the MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

A buffer layer 240 is formed on the interconnect structure 230. In the present embodiment, the buffer layer 240 includes a dielectric material such as silicon oxide. Alternatively, the buffer layer 240 may optionally include silicon nitride. The buffer layer 240 is formed by CVD, PVD, or other suitable techniques. The buffer layer 240 is planarized to form a smooth surface by chemical mechanical polishing (CMP). A carrier substrate 250 is bonded with the buffer layer 240 so that processing the back side 206 of the substrate 202 can be performed. The carrier substrate 250 is bonded to the semiconductor substrate 202 by molecular forces. The carrier substrate 250 may be similar to the substrate 202 and includes a silicon material. Alternatively, the carrier substrate 250 may optionally include a glass substrate. The carrier substrate 250 provides protection for the various features formed on the front side 204, and also provides mechanical strength and support for processing the back side 206 of the substrate 202 as discussed below. The buffer layer 240 also provides electrical isolation between the semiconductor substrate 202 and the carrier substrate 250.

A process 260 is performed to thin the substrate 202 from the back side 206. In the present embodiment, the process 260 includes a grinding process, diamond scrubbing process, chemical-mechanical polishing (CMP) process, or other suitable techniques. A substantial amount of substrate material may be removed from the substrate 202 during the process 260. After process 260 is performed, the substrate 202 has a new thickness 205B, which ranges from about 0.5 um to about 20 um. In the present embodiment, the new thickness 205B is about 2 um. It is understood that the particular thicknesses disclosed herein are mere examples and that other thicknesses may be implemented depending on the type of application and design requirements of the image sensor device 200.

Figure 2C:
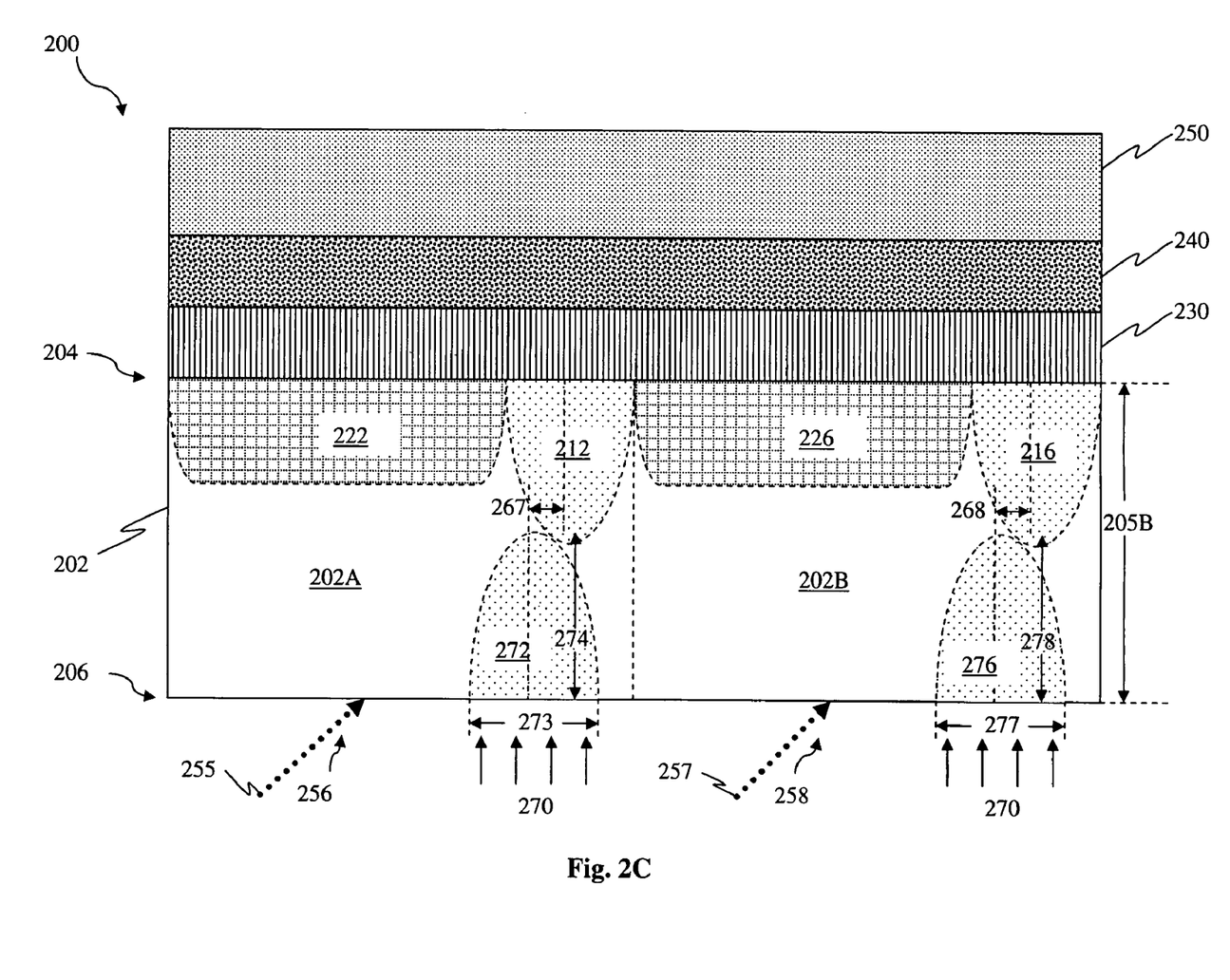

Referring to FIG. 2C, an implantation process 270 is performed to the back side 206 of the substrate 202 to form doped isolation regions 272 and 276 in pixels 202A and 202B, respectively. For example, a photoresist layer may be patterned by a lithography process to define openings for the doped isolation regions 272 and 276. The implantation process 270 uses a dopant that is the same type of dopant used to form the doped isolation regions 212 and 276. In the present embodiment, the implantation process 270 uses boron as a dopant and has an implantation energy ranging from about 100 KeV to about 1200 KeV, preferably between about 400 KeV to about 500 KeV. The implantation process 270 in the present embodiment also uses a dose level ranging from about $3 \times 10^{12}$ atoms/cm$^2$ to about $3 \times 10^{14}$ atoms/cm$^2$, preferably about $3 \times 10^{12}$ to $1 \times 10^{13}$ atoms/cm$^2$. In another embodiment, the implantation process 270 uses phosphorous as a dopant and has an implantation energy ranging from about 100 KeV to about 2000 KeV, preferably between about 600 KeV to about 800 KeV. The implantation process 270 also uses a dose level ranging from about $3 \times 10^{12}$ atoms/cm$^2$ to about $3 \times 10^{14}$ atoms/cm$^2$, preferably between about $3 \times 10^{12}$ and $1 \times 10^{13}$ atoms/cm$^2$. The doped isolation regions 272 and 276 have widths 273 and 277, respectively, and depths 274 and 278, respectively. The widths 273 and 277 may range from about 0.1 um to about 0.8 um, and the depths 274 and 278 may range from about 0.5 um to about 2 um. In the present embodiment, the widths 273 and 277 are about 0.4 um, and the depths 274 and 278 are about 1 um. It is understood that the specified parameters of the implantation process and dimensions of the doped isolation regions are mere examples and that other values may be implemented.

Similar to the doped isolation regions 212 and 216, the doped isolation regions 272 and 276 help isolate pixels 202A and 202B by reducing the risk of carriers from spreading between adjacent pixels. It should be noted that the doped isolation features 272 and 212 are shifted with respect to each other by a distance 267, and the doped isolation features 216 and 276 are also shifted with respect to each other by a distance 268. It has been observed that the shifted structure of the doped isolation regions 212 and 272 (and also 216 and 276) offers advantages in reducing cross-talk. For example, the pixels 202A, 202B are operable to sense light radiation 255, 257 directed towards the back side 206 of the substrate 202. The light radiation 255, 257 may be projected towards the pixels 202A, 202B at an angle 256, 258. The angle 256, 258 may also be referred to as an optical ray light injection angle (or light injection angle). In a situation where the light injection angle is close to normal incidence (e.g., straight on), light radiation traveling into pixels 202A, 202B does not travel to the neighboring or adjacent pixels. Thus, carriers such as electrons or holes excited by the light radiation (or generated thereby) are mostly collected by the proper pixel 202A, 202B (which is the intended operation). Hence cross-talk between pixels 202A and 202B is not as severe in this case. However, in a situation where the light injection angle 256, 258 starts to deviate from normal incidence (e.g., oblique incidence), light radiation 255 projected towards the pixel 202A may excite carriers that spread into the adjacent pixel 202B and are collected by pixel 202B. In effect, the pixel 202B detects an improper electrical signal corresponding to light radiation that is directed towards the neighboring pixel 202A, which degrades the photo response characteristics of the image sensor device 200.

In the present embodiment, the doped isolation regions 212 and 272 create a shifted potential barrier between pixels 202A and 202B. For example, carriers may be generated in the doped isolation feature 212 as a result of the light radiation 255 being projected towards the pixel 202A at a non-90 degree angle. Some of the carriers would have spread to pixel 202B which would have led to cross-talk, but instead the carriers are bounced back to the pixel 202A due to the shifted potential barrier created by the doped isolation regions 212 and 272. Thus, the shifted doped isolation regions 212 and 272 are effective at preventing carrier spreading between adjacent pixels, particularly when the light radiation projected towards the pixel has a non-normal incidence light injection angle. Accordingly, the shifted doped isolation regions of the present embodiment are advantageous in reducing cross-talk.

The shift distance 267 between the doped isolation regions 212 and 272 may be optimized for a specific light injection angle. In this respect, the shift distance 267 is correlated to the light injection angle 256. It should be noted that manufacturing needs may also require different light injection angles for different semiconductor devices. Therefore, the shift distance 267 between the doped isolation regions 212 and 272 may be varied to accommodate a variety of situations requiring different light injection angles. In the present embodiments, a function may be used to describe the correlation between the shift distance 267 and the light injection angle 256. The shift distance 267 equals tan(light injection angle)$\times$($\frac{1}{2}$)$\times$(thickness of substrate after thinning). For example, in one embodiment where the thickness 205B of the substrate 202 is about 2 um, and the light injection angle 256 is about 30 degrees, the shift distance 267 between the doped isolation features 212 and 272 is about tan(30)$\times$($\frac{1}{2}$)$\times$(2 um)=0.57 um. It is understood that the light injection angle may vary for various positions in the grid of pixels, and thus the shift distance will vary across the grid of pixels as well. For example, the pixels located closer to the center portion of the grid may have doped isolation regions that have less shift than those located towards the left side or right side of the grid. Further, the pixels on one side of the grid may have doped isolation regions that are shifted in a direction opposite than those located on the other side of the grid. Moreover, some pixels at the center may have doped isolation regions that are not shifted.

Figure 2D:
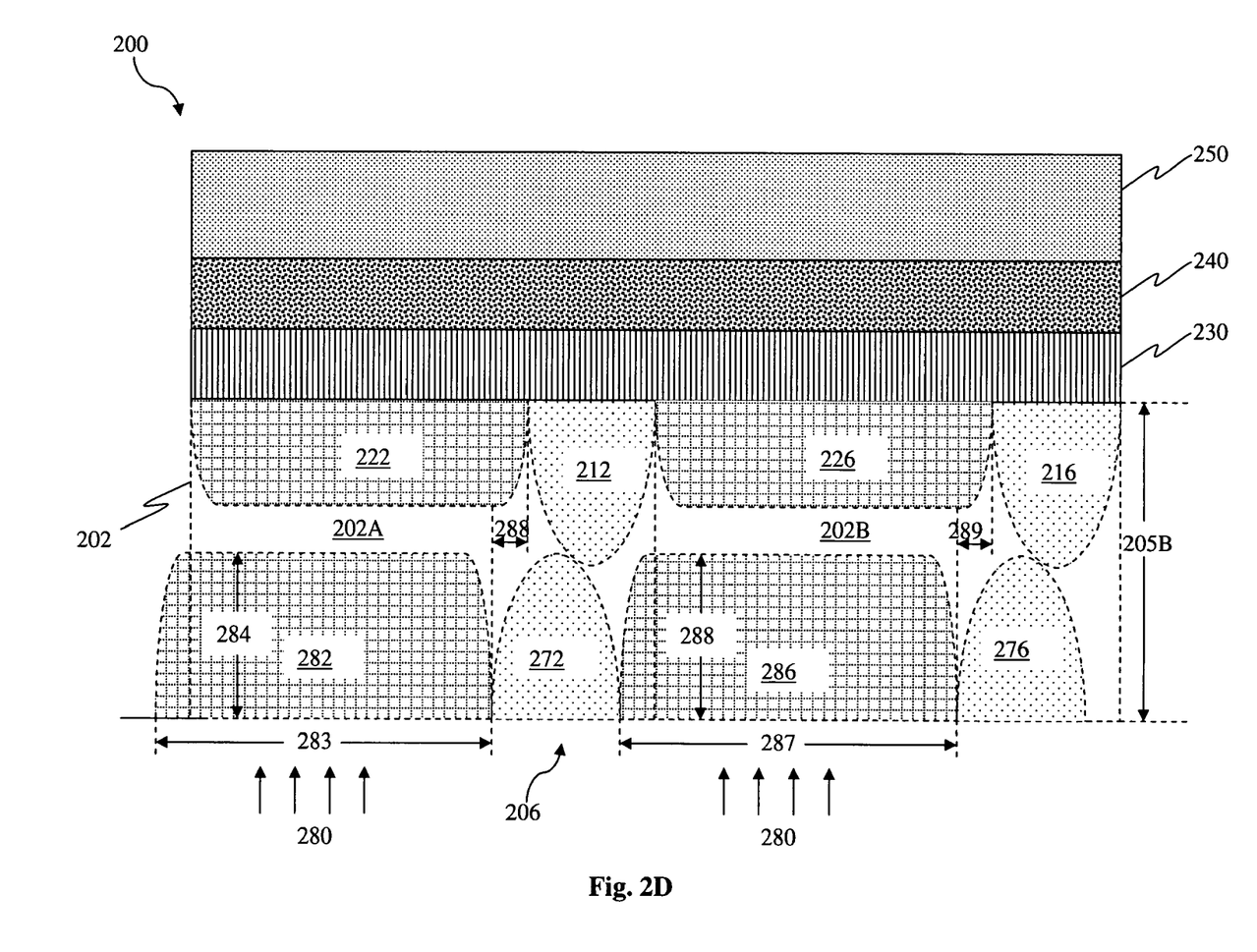

Referring to FIG. 2D, in some embodiments, an implantation process 280 is optionally performed to the back side 206 of the substrate 202 to form light sensing regions 282 and 286 of pixels 202A and 202B, respectively. The implantation process 280 uses a dopant that is the same type of dopant used to form the light sensing regions 222 and 226. In the present embodiment, the implantation process 280 uses phosphorous or arsenic as a dopant. In another embodiment, the implantation process 280 uses boron as a dopant. The doped regions 282 and 286 formed by the implantation process 280 also have widths 283 and 287, respectively, and depths 284 and 288, respectively. The widths 283 and 287 may range from about 0.5 um to about 5 um, and the depths 284 and 288 may range from about 0.5 um to about 2.5 um. In the present embodiment, the widths 283 and 287 are about 1.35 um, and the depths 284 and 288 are about 1.5 um.

The light-sensing regions 282 and 286 are formed adjacent to the doped isolation features 272 and 276, respectively. Similar to light sensing regions 222 and 226, the light sensing regions 282 and 286 are operable to sense light as well. It has been observed that including two light sensing regions 222 and 282 in the pixel 202A increases the pixels light sensing efficiency. However, it is understood that only one of the light sensing regions 222 or 282 is required. The same is true for the pixel 202B. Also, it should be noted that the light sensing regions 282 and 222 may be shifted with respect to each other by a distance 288, and the light sensing regions 286 and 226 may also be shifted with respect to each other by a distance 289. In the present embodiment, the shift distance 288 between the light sensing regions 222 and 282 is approximately equal to the shift distance 267 between the doped isolation regions 212 and 272, and the shift distance 289 between the light sensing regions 226 and 286 is approximately equal to the shift distance 268 between the doped isolation regions 216 and 276.

Additionally, it should be noted that the exact sequence of forming the various doped isolation regions and light sensing regions described above is not important. For example, the light sensing region 222 may be formed before or after forming the doped isolation region 212. Further, although the present embodiment disclosed forming two doped isolation features per pixel, multiple isolation features may be formed in the pixel using the same concepts and processing steps discussed above.

Figure 2E:
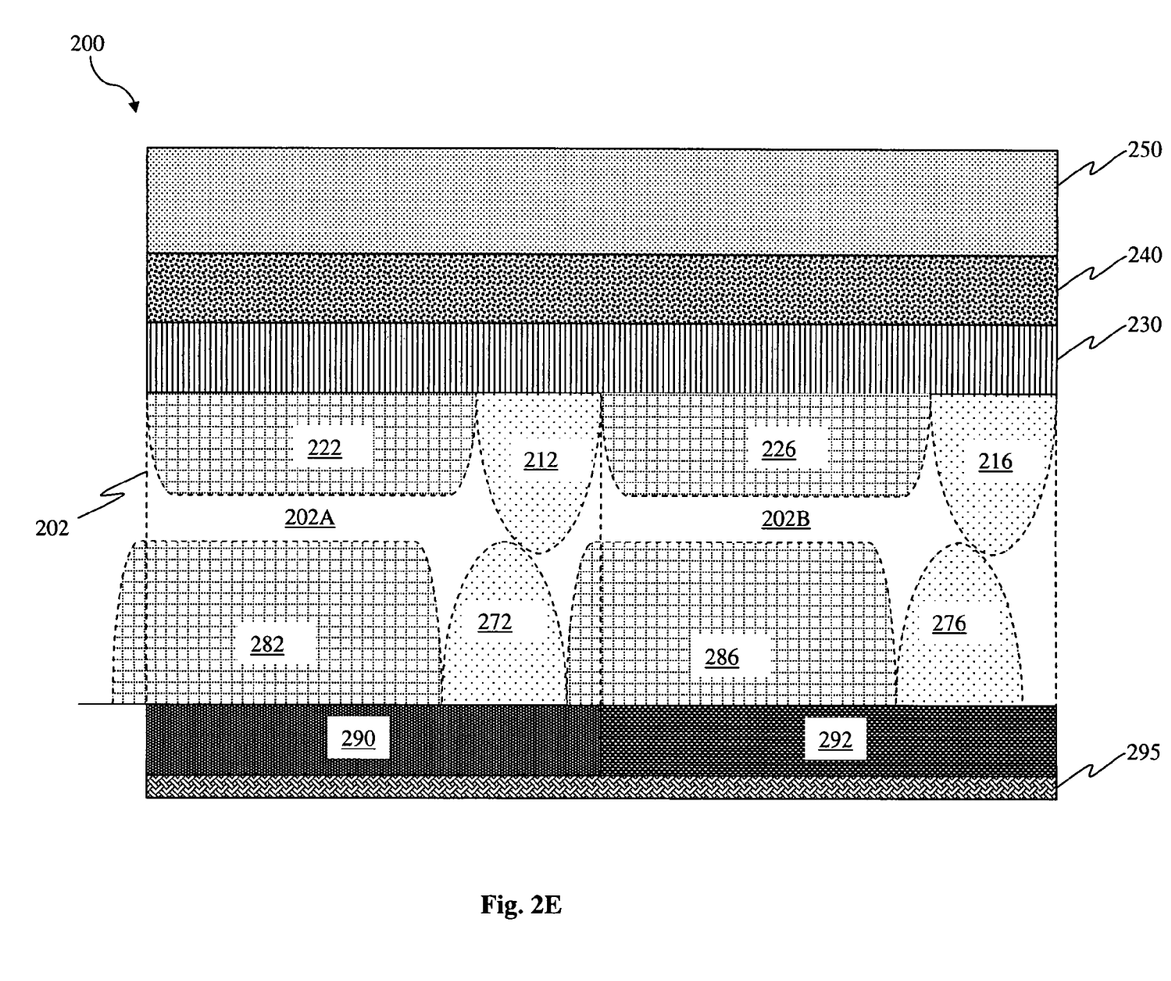

Referring to FIG. 2E, a color filter layer is formed over the back side 206 of the substrate. The color filter layer can support different color filters (e.g., red, green, and blue), and may be positioned such that the incident light radiation is directed thereon and there through. For example, the color filter layer includes a color filter 290 for filtering light radiation of a first wavelength to the pixel 202A and a color filter 292 for filtering light radiation of a second wavelength to the pixel 202B. The color filter layer 290, 292 may include a dye-based (or pigment based) polymer or resin for filtering a specific wavelength band. A plurality of micro-lens 295 is formed over the color filters 290, 292 for directing light radiation towards the pixels 202A and 202B. The micro-lens 295 may be positioned in various arrangements and have various shapes depending on a refractive index of material used for the micro-lens and distance from the sensor surface.

Referring to FIG. 3, illustrated is a flowchart of a method 300 for fabricating a front-side illuminated (FSI) image sensor device. The method 300 begins with block 310 in which a semiconductor substrate is provided. The method 300 continues with block 320 in which a first implantation process is performed to the substrate to form a first doped isolation feature, the first implantation process using a first implant energy. The method 300 continues with block 330 in which a first light sensing region is formed. The method 300 continues with block 340 in which a second implantation process is performed to the substrate to form a second doped isolation feature, the second implantation process using a second implant energy different from the first implant energy. The first and second doped isolation features are shifted with respect to each other. The method 300 continues with block 350 in which a second light sensing region is formed.

Referring to FIG. 4A, an FSI image sensor device 400 includes a substrate 402 with pixels 402A and 402B. The substrate 402 is similar to the substrate 202 described above and is doped with either a P-type dopant or an N-type dopant. In this embodiment, the substrate 402 is doped with a P-type dopant such as boron (e.g., P-type substrate). In another embodiment, the substrate 402 is doped with an N-type dopant such as phosphorous (e.g., N-type substrate). The pixels 402A and 402B are operable to sense radiation such as light radiation directed towards the front side of the substrate 402. Similar to the pixels 202A and 202B described previously, the pixels 402A and 402B have sensing regions operable to sense light radiation and doped isolation features operable to reduce cross-talk. These light sensing regions and isolation features are formed by various processes described below.

An implantation process 410 is performed to the substrate 402 to form deep doped isolation regions 472 and 476 in pixels 402A and 402B, respectively. For example, a photoresist layer may be patterned by a lithography process to define openings for the deep doped isolation regions 472 and 476. The implantation process 410 uses a dopant that is a same type of dopant used to dope the substrate 402. The doped isolation regions 472 and 476 are operable to reduce carrier spreading between adjacent pixels 402A and 402B. In the present embodiment, the deep implantation process 410 uses boron as a dopant and has an implantation energy ranging from about 400 KeV to about 3000 KeV. The implantation process 410 uses a dose level ranging from about $3 \times 10^{12}$ atoms/cm$^2$ to about $3 \times 10^{14}$ atoms/cm$^2$, preferably between about $3 \times 10^{12}$ and about $1 \times 10^{13}$ atoms/cm$^2$. In an alternative embodiment, the implantation process 410 uses phosphorous as a dopant and has an implantation energy ranging from about 600 KeV to about 5000 KeV. The implantation process 410 in the alternative embodiment also uses a dose level ranging from about $3 \times 10^{12}$ atoms/cm$^2$ to about $3 \times 10^{14}$ atoms/cm$^2$, preferably between about $3 \times 10^{12}$ and about $1 \times 10^{13}$ atoms/cm$^2$. The doped isolation regions 472 and 476 have widths 473 and 477, respectively, and depths 474 and 478, respectively. The widths 473 and 477 may range from about 0.1 um to about 0.8 um, and the depths 474 and 478 may range from about 0.5 um to about 2 um. In the present embodiment, the widths 473 and 477 are about 0.4 um, and the depths 474 and 478 are about 1 um. It is understood that the specified parameters of the implantation process and dimensions of the doped isolation regions are mere examples and that other values may be implemented.

An implantation process 420 is performed to the substrate 402 to light sensing regions 482 and 486 of pixels 402A and 402B, respectively. The implantation process 480 uses a dopant that is different from the type of dopant used to dope the substrate 202 (and hence different from the dopant used in the implantation process 410). In the present embodiment, the deep implantation process 420 uses phosphorous as a dopant. In another embodiment, the deep implantation process 420 uses boron as a dopant. The light sensing regions 482 and 486 have widths 483 and 487, respectively, and depths 484 and 488, respectively. The widths 483 and 487 may range from about 0.5 um to about 5 um, and the depths 484 and 488 may range from about 0.5 um to about 2.5 um. In the present embodiment, the widths 483 and 487 are about 1.35 um, and the depths 484 and 488 are about 1.5 um. The light sensing regions 482 and 486 are formed adjacent to the doped isolation regions 472 and 476, respectively.

Referring to FIG. 4B, an implantation process 415 is performed to the substrate 402 to form doped isolation regions 412 and 416 in pixels 402A and 402B, respectively. The implantation process 415 uses a dopant that is the same type of dopant used to dope the substrate 202. In the present embodiment, the implantation process 415 uses boron as a dopant and has an implantation energy ranging from about 100 KeV to about 1200 KeV, preferably between about 400 KeV to about 500 KeV. The implantation process 415 in the present embodiment also uses a dose level ranging from about $3 \times 10^{12}$ atoms/cm$^2$ to about $3 \times 10^{14}$ atoms/cm$^2$, preferably between about $3 \times 10^{12}$ and about $1 \times 10^{13}$ atoms/cm$^2$. In an alternative embodiment, the implantation process 415 uses phosphorous as a dopant and has an implantation energy ranging from about 100 KeV to about 2000 KeV, preferably between about 600 KeV to about 800 KeV. The implantation process 415 also uses a dose level ranging from about $3 \times 10^{12}$ atoms/cm$^2$ to about $3 \times 10^{14}$ atoms/cm$^2$, preferably between about $3 \times 10^{12}$ and about $1 \times 10^{13}$ atoms/cm$^2$. The doped isolation regions 412 and 416 have widths 413 and 417, respectively, and depths 414 and 418, respectively. The widths 413 and 417 may range from about 0.1 um to about 0.8 um, and the depths 414 and 418 may range from about 0.5 um to about 2 um. In the present embodiment, the widths 413 and 417 are about 0.4 um, and the depths 414 and 418 are about 1 um. It is understood that the specified parameters of the implantation process and dimensions of the doped isolation regions are mere examples and that other values may be implemented.

An implantation process 425 is performed to the substrate 402 to form light sensing regions 422 and 426 of pixels 402A and 402B, respectively. The implantation process 425 uses a dopant that is different from the type of dopant used to dope the substrate 402 (and hence different from the dopant used in the implantation process 415). In the present embodiment, the implantation process 425 uses phosphorous or arsenic as a dopant. In another embodiment, the implantation process 425 uses boron as a dopant. The light sensing regions 422 and 426 have widths 423 and 427, respectively, and depths 424 and 428, respectively. The widths 423 and 427 may range from about 0.5 um to about 5 um, and the depths 424 and 428 may range from about 0.2 um to about 1.5 um. In the present embodiment, the widths 423 and 427 are about 1.35 um, and the depths 424 and 428 are about 0.4 um.

It should be noted that the light sensing regions can be varied from one another, such as having different junction depths, thicknesses, and so forth. Further, it is understood that although the pixels 402A and 402B are generally illustrated as photodiodes for the sake of example, other pixels types may be implemented including pinned layer photodiodes, photogates, reset transistors, source follower transistors, and transfer transistors. It has been observed that having two light sensing regions 422 and 482 in the same pixel 402A increases the pixel's light sensing efficiency, but only one of the light sensing regions 422 or 482 is required. The same is true for pixel 402B.

In the present embodiment, the doped isolation features 412 and 472 are shifted with respect to each other by a shift distance 489. The light sensing regions 422 and 482 are also shifted with respect to each other by the shift distance 489. The shifted structure of the doped isolation features 412 and 472 are effective at reducing cross-talk for the same reasons as discussed above in the image sensor device 200 of FIG. 2. Also, the shift distance 489 between the doped isolation features 412 and 472 may be varied depending on a light injection angle 456 as well. The shift distance 489 is correlated to the light injection angle 456, and the correlation may be expressed by a function. In the present embodiment, the shift distance 489 equals to tan(light injection angle)×(depth of doped isolation feature). It is understood that the light injection angle may vary for various positions in the grid of pixels, and thus the shift distance will vary across the grid of pixels as well. For example, the pixels located closer to the center portion of the grid may have doped isolation regions that have less shift than those located towards the left side or right side of the grid. Further, the pixels on one side of the grid may have doped isolation regions that are shifted in a direction opposite than those located on the other side of the grid. Moreover, some pixels at the center may have doped isolation regions that are not shifted.

In comparison with the BSI embodiment described in method 100, it may be observed that the FSI embodiment described in method 300 does not involve bonding the substrate with a carrier substrate or thinning down the substrate. However, the FSI embodiment involves implanting ions in the same side of the substrate but at different locations and using different implantation energies to form the shifted doped isolation features 412 and 472 (also 416 and 476), and the shifted light sensing regions 422 and 482 (also 426 and 486).

Referring to FIG. 4C, the method 300 may also continue with additional processing. For example, an interconnect structure 430 similar to the interconnect structure 230 of FIG. 2 may be formed on the substrate 402. In addition, color filters 490 and 492 (similar to color filters 290 and 292 of FIG. 2) and micro-lens 495 (similar to micro-lens 295 of FIG. 2) may be formed over the interconnect structure 430.

Referring to FIG. 5, illustrated is another embodiment of a BSI image sensor device 500. The image sensor device 500 is similar to the image sensor device 200 of FIG. 2 except for the differences discussed below. Accordingly, similar features in FIGS. 2 and 5 are numbered the same for the sake of simplicity and clarity. The image sensor device 500 utilizes shifted trench isolation structures instead of shifted doped isolation regions. Thus, the shifted trench isolation structures are operable isolate and reduce cross-talk between adjacent pixels. In the present embodiment, the image sensor device 500 includes a substrate 202 having a front side 204 and a back side 206. The light sensing regions 222, 226, 282, and 286 may be formed using similar processes as described in the method 100 of FIG. 1 or the method 300 of FIG. 3. The isolation structures 512 and 516 are formed by patterning a photoresist layer on the front side 204 to define openings and etching, such as dry etching, the substrate 202 from the front side to form trenches. The trenches are then filled with a dielectric material such as silicon oxide or silicon nitride to form the isolation structures 512 and 516. The isolation structures 512, 516 have a width ranging from about 0.1 um to about 0.8 um, and a depth ranging from about 0.5 um to about 2 um. In the present embodiment, the width is about 0.4 um, and the depth is about 1 um. It is understood that the specified dimensions of the trench isolation structures are mere examples and that other values may be implemented.

The substrate 202 may be bonded to a carrier substrate in a process similar to the process 260 of FIG. 2. The substrate 202 may also be thinned from the back side 206 of the substrate 202 to have a thinned-down thickness 505. In the present embodiment, the thickness 505 is about 2 um. The isolation structures 572 and 576 are formed by patterning a photoresist layer on the back side 206 to define openings and etching, such as dry etching, the substrate 202 from the back side to form trenches. The trenches are then filled with a dielectric material such as silicon oxide or silicon nitride to form isolation structures 572 and 576. The isolation structures 572, 576 have a width ranging from about 0.1 um to about 0.8 um, and a depth ranging from about 0.5 um to about 2 um. In the present embodiment, the width is about 0.4 um, and the depth is about 1 um. It is understood that the specified dimensions of the trench isolation structures are mere examples and that other values may be implemented.

In the present embodiment, the isolation features 512 and 572 are shifted with respect to each other by a distance 589. As is the case for the BSI embodiment described above in FIG. 2, the shift distance 589 is correlated to a light injection angle as well. The correlation between the shift distance 589 and the light injection angle may be expressed by a similar function as was discussed in FIG. 2. In the present embodiment, the shift distance 589 equals to tan(light injection angle)×(½)×(thickness of substrate after thinning). It is understood that the light injection angle may vary for various positions in the grid of pixels, and thus the shift distance will vary across the grid of pixels as well. For example, the pixels located closer to the center portion of the grid may have doped isolation regions that have less shift than those located towards the left side or right side of the grid. Further, the pixels on one side of the grid may have doped isolation regions that are shifted in a direction opposite than those located on the other side of the grid. Moreover, some pixels at the center may have doped isolation regions that are not shifted.

Additional processing may be performed on the image sensor device 500. For example, an interconnect structure 230 may be formed on the front side 204 of the substrate 202. A buffer layer 240 may be formed on the interconnect structure 230, and a carrier substrate 250 may be bonded to the front side 204 of the substrate 202 with the buffer layer 240. Color filters 290 and 292 and micro-lenses 295 may also be formed on the back side 206 of the substrate 202.

In summary, the methods and devices disclosed herein provide an effective and efficient approach for reducing cross-talk in an image sensor device The methods and devices disclosed herein take advantage of forming isolation features that are shifted with respect to each other to prevent carrier spreading between adjacent pixels. The amount and shift and direction of the shift may be correlated to the position of the pixel on the grid and injection angel of the light radiation. In some embodiments, the isolation features are doped isolation regions. In another embodiment, the isolation features are trenches etched in the substrate and filled with a dielectric material. In doing so, the present embodiment offers several advantages over prior art devices, it being understood that different embodiments may have different advantages. An advantage of the present embodiment is that the shifted structure of the isolation features is effective at reducing cross-talk when light sensed by a pixel has a light injection angle that is not normal incidence. The shifted isolation features create a shifted potential barrier that bounces back carriers excited by the light radiation, so that the carriers do not spread into an adjacent pixel to generate improper electrical signals which would lead to cross-talk. Another advantage of the present embodiment is that having more than one light sensing region that are shifted with respect to each other in one pixel leads to greater light sensing efficiency. Furthermore, the steps outlined are compatible with a CMOS processing flow.

The present disclosure describes a method for fabricating an image sensing semiconductor device, including, providing a semiconductor substrate having a front side and a back side, forming a first isolation structure at the front side of the semiconductor substrate, thinning the semiconductor substrate from the back side, and forming a second isolation structure at the back side of the semiconductor substrate. The first and second isolation structures are shifted with respect to each other.

The present disclosure also describes a method for fabricating an image sensing semiconductor device, including, providing a semiconductor substrate, performing a first implantation process to the substrate to form a first doped isolation feature, the first implantation process using a first implant energy, performing a second implantation process to the substrate to form a second doped isolation feature, the second implantation process using a second implant energy different from the first implant energy, and forming first and second light sensing elements in the substrate. The first and second doped isolation features are disposed between the first light sensing element and the second light sensing element. The first and second doped isolation features are shifted with respect to each other.

The present disclosure also describes an image sensing semiconductor device, including, a substrate having a front side, a back side, and a thickness, a first isolation structure extending from the front side of the substrate, a second isolation structure extending from the back side of the substrate, and first and second light sensing elements formed in the substrate. The first and second isolation structures are disposed between the first light sensing element and the second light sensing element. The first and second isolation structures are shifted with respect to each other.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating an image sensor device, comprising:
   providing a semiconductor substrate having a front side and a back side;
   forming a semiconductor component in the substrate;
   forming a first isolation structure at the front side of the semiconductor substrate;
   thinning the semiconductor substrate from the back side; and
   forming a second isolation structure at the back side of the semiconductor substrate;
   wherein the first and second isolation structures are located on the same side of the semiconductor component and are shifted with respect to each other.

2. The method of claim 1, wherein the forming the semiconductor component includes forming a light sensing region at the front side of the semiconductor substrate adjacent to the first isolation structure.

3. The method of claim 1, wherein light radiation is projected to the image sensor device at a light injection angle, and wherein the first isolation structure and the second isolation structure are shifted by a distance correlated to the light injection angle.

4. The method of claim 1, wherein forming the first isolation structure includes etching a first trench extending from the front side of the semiconductor substrate and filling the first trench with a dielectric material; and
   wherein forming the second isolation structure includes etching a second trench extending from the back side of the semiconductor substrate and filling the second trench with the dielectric material.

5. The method of claim 1, wherein forming the first isolation structure includes implanting boron into the front side of the semiconductor substrate using an implantation energy from about 400 to about 500 KeV and a dose level from about $3 \times 10^{12}$ to about $1 \times 10^{13}$ atoms/cm$^2$; and
   wherein forming the second isolation structure includes implanting boron into the back side of the semiconductor substrate using an implantation energy from about 400 to about 500 KeV and a dose level from about $3 \times 10^{12}$ to about $1 \times 10^{13}$ atoms/cm$^6$.

6. The method of claim 1, wherein forming the first isolation structure includes implanting phosphorous into the front side of the semiconductor substrate using an implantation energy from about 600 to about 800 KeV and a dose level from about $3 \times 10^{12}$ to about $1 \times 10^{13}$ atoms/cm$^2$; and
   wherein forming the second isolation structure includes implanting phosphorous into the back side of the semiconductor substrate using an implantation energy from about 600 to about 800 KeV and a dose level from about $3 \times 10^{12}$ to about $1 \times 10^{13}$ atoms/cm$^2$.

7. The method of claim 1, further comprising, prior to thinning the device substrate, bonding a carrier substrate to the front side of the semiconductor substrate.

8. The method of claim 2, further comprising forming another light sensing region at the back side of the semiconductor substrate adjacent to the second isolation structure.

9. The method of claim 3, wherein the distance is approximately equal to tan(the light injection angle)×(½)×(a thickness of the semiconductor substrate after thinning).

10. A method of fabricating an image sensor device, comprising:
providing a semiconductor substrate;
performing a first implantation process to the substrate to form a first doped isolation feature, the first implantation process using a first implant energy;
performing a second implantation process to the substrate to form a second doped isolation feature, the second implantation process using a second implant energy different from the first implant energy; and
forming first and second light sensing elements in the substrate;
wherein the first and second doped isolation features are disposed between the first light sensing element and the second light sensing element, and wherein the first and second doped isolation features are shifted with respect to each other.

11. The method of claim 10, wherein the first implant energy is greater than the second implant energy;
wherein the first doped isolation feature is a deep isolation feature; and
wherein the second doped isolation feature is a shallow isolation feature.

12. The method of claim 10, wherein the first implantation process includes implanting boron with the first implant energy ranging from about 400 to about 3000 KeV and a dose level ranging from about $3 \times 10^{12}$ to about $1 \times 10^{13}$ atoms/cm$^2$; and
wherein the second implantation process includes implanting boron with the second implant energy ranging from about 100 to about 1200 KeV and a dose level ranging from about $3 \times 10^{12}$ to about $1 \times 10^{13}$ atoms/cm$^2$.

13. The method of claim 10, wherein the first implantation process includes implanting phosphorous with the first implant energy ranging from about 600 to about 5000 KeV and a dose level ranging from about $3 \times 10^{12}$ to about $1 \times 10^{13}$ atoms/cm$^2$;
wherein the second implantation process includes implanting phosphorous with the second implant energy ranging from about 100 to about 2000 KeV and a dose level ranging from about $3 \times 10^{12}$ to about $1 \times 10^{13}$ atoms/cm$^2$.

14. The method of claim 11, wherein light radiation is projected to the image sensor device at a light injection angle, and wherein the shallow isolation feature and the deep isolation feature are shifted by a distance correlated to the light injection angle.

15. A method of fabricating an image sensor device, comprising:
providing a substrate having a front side and a back side;
forming a first isolation structure in the substrate, the first isolation structure extending from the front side of the substrate toward the back side of the substrate;
thinning the substrate from the back side, the substrate having a thickness after the thinning;
forming a second isolation structure in the substrate, the second isolation structure extending from the back side of the substrate toward the front side of the substrate; and
forming first and second light sensing elements in the substrate, the first and second light sensing elements being formed on opposite sides of the first and second isolation features;
wherein the forming the first and second isolation structures are carried out in a manner so that the first and second isolation structures are shifted with respect to each other.

16. The method of claim 15, wherein the forming the first and second isolation structures are carried out in a manner so that the first and second isolation features are shifted by a distance, wherein the distance is a function of a light injection angle at which a radiation wave is projected toward the image sensor device.

17. The method of claim 15, wherein:
the forming the first isolation structure includes forming a doped first isolation structure; and
the forming the second isolation structure includes forming a doped second isolation structure.

18. The method of claim 15, wherein:
the forming the first isolation structure includes forming a first trench and filling the first trench with a dielectric material; and
the forming the second isolation structure includes forming a second trench and filling the second trench with a dielectric material.

19. The method of claim 15, further including:
forming a color filter layer over the back side of the substrate; and
forming a micro lens layer over the color filter layer;
wherein the forming the first and second light sensing elements is carried out in a manner so that the first and second light sensing elements are operable to sense light projected toward the back side of the substrate.

20. The method of claim 16, wherein the distance is approximately equal to tan(the light injection angle)×(½)×(the thickness of the substrate).

* * * * *